(12) United States Patent
Henderson et al.

(10) Patent No.: US 8,319,325 B2
(45) Date of Patent: Nov. 27, 2012

(54) INTRA-DIE ROUTING USING BACK SIDE REDISTRIBUTION LAYER AND ASSOCIATED METHOD

(75) Inventors: Brian M. Henderson, San Diego, CA (US); Chandra Sekhar Nimmagadda, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 764 days.

(21) Appl. No.: 12/483,878

(22) Filed: Jun. 12, 2009

(65) Prior Publication Data

US 2010/0314737 A1    Dec. 16, 2010

(51) Int. Cl.
*H01L 23/52* (2006.01)
(52) U.S. Cl. ............ 257/686; 257/778; 257/E21.511
(58) Field of Classification Search ........... 257/686, 257/774, 698, E21.511, E23.141, 778, E23.011; 438/109, 121
See application file for complete search history.

(56) References Cited

U.S. PATENT DOCUMENTS

| | | | |
|---|---|---|---|
| 4,889,832 A | 12/1989 | Chatterjee | |
| 5,406,125 A * | 4/1995 | Johnson et al. | 257/774 |
| 5,424,245 A | 6/1995 | Gurtler et al. | |
| 5,973,396 A * | 10/1999 | Farnworth | 257/698 |
| 6,316,981 B1 | 11/2001 | Rao et al. | |
| 6,583,030 B1 | 6/2003 | Grassl | |
| 2005/0186705 A1 | 8/2005 | Jackson et al. | |
| 2007/0284747 A1 | 12/2007 | Yao et al. | |

FOREIGN PATENT DOCUMENTS

FR    2910704    6/2008

OTHER PUBLICATIONS

International Search Report and Written Opinion—PCT/US2010/038376, International Search Authority—European Patent Office—Nov. 30, 2010.

* cited by examiner

*Primary Examiner* — Roy Potter
(74) *Attorney, Agent, or Firm* — Sam Talpalatsky; Michelle Gallardo; Jonathan T. Velasco

(57) ABSTRACT

A semiconductor die includes: a body portion with a plurality of circuit components, a front side including electrical couplings to the plurality of circuit components, a back side having a redistribution layer with a first electrical terminal coupled to the plurality of circuit components by a first through-silicon via, and a second through-silicon via electrically coupled to a third through-silicon via by a trace on the back side redistribution layer. Also, disclosed is a method of coupling circuit components on a die using through-silicon vias and a back side redistribution layer.

33 Claims, 3 Drawing Sheets

INTRA-DIE ROUTING USING BACK SIDE REDISTRIBUTION LAYER AND ASSOCIATED METHOD

FIELD OF THE INVENTION

Disclosed embodiments are directed to an arrangement for routing electrical signals between circuit components of a die using a back side redistribution layer and to an associated method, and, more specifically, toward an arrangement for routing electrical signals between circuit components of a die using through-silicon vias and a back side redistribution layer, which redistribution layer may include an electrical contact for electrically coupling the die to another die stacked thereon and to an associated method.

BACKGROUND OF THE INVENTION

Silicon dies may include a plurality of conductive layers that form circuit components and traces coupling the components, and these conductive layers may be separated by layers of dielectric material. Vias extend through the dielectric material to electrically interconnect the various layers. One side of the die, which may be referred to as the front side of the die, includes a plurality of electrical contacts for coupling the die to its package, and then an external circuit, on a motherboard, for example. The opposite side of the die, which may be referred to as the back side of the die, may include connections comprising through-silicon vias, such that a subsequent die may be directly mounted to the backside of the first die, with electrical connections between the two die. Through-silicon vias provide a direct connection between circuits on one die to circuits on the second die.

In top level chip design, decisions must be made regarding the pathways used to connect circuit components on each layer of the die with one another and with elements on different layers of the die. With higher levels of silicon integration and the use of wider buses, it is becoming increasingly difficult to route all required interconnections using the available layers. It sometimes becomes necessary to add additional metal layers to a die to accommodate the required intra-die interconnections. Adding additional layers, however, increases the manufacturing cost of the die. It would therefore be desirable to provide an arrangement that allows for additional interconnections and/or more flexibility in routing connections between circuit components on a die without adding additional metal layers to the die.

SUMMARY OF THE INVENTION

Exemplary embodiments are directed to systems and methods for coupling components of a semiconductor die using a back side redistribution layer. An aspect comprises a semiconductor die that has a body portion with a plurality of circuit components, a front side with electrical connections to the plurality of circuit components, and a back side including a redistribution layer. The redistribution layer includes a first electrical terminal coupled to the circuit components by a first through-silicon via. In addition, a second through-silicon via is electrically coupled to a third through-silicon via by a trace on the back side redistribution layer.

Another aspect comprises a semiconductor die that includes a body portion having a plurality of circuit components and a plurality of conductive layers separated by layers of dielectric material and a passivation layer that forms a back side of the die. The die also includes a front side with electrical connections to the plurality of circuit components. First and second through-silicon vias extend to the back side, and a trace on the back side electrically couples the first and second through-silicon vias.

Another aspect comprises a semiconductor component that includes a first die and a second die stacked on the first die. The first die includes a body portion including a plurality of circuit components, a front side comprising electrical connections to the plurality of circuit components, and a back side including a redistribution layer having a first electrical contact coupled to at least one of the plurality of circuit components by a first through-silicon via. The first die also includes a second through-silicon via electrically coupled to a third through-silicon via by a trace on the back side redistribution layer. The second die has a front side having at least one conductive element electrically coupled to the first die first electrical contact.

Another aspect comprises a method that includes providing a first semiconductor die having a front side, a back side, a first circuit component, a second circuit component and a passivation layer. The method includes forming a first through-silicon via and a second through-silicon via in the first semiconductor die, electrically coupling the first circuit component to the first through-silicon via, electrically coupling the second circuit component to the second through-silicon via, and forming a trace on the back side to electrically couple the first through-silicon via and the second through-silicon via.

Another aspect comprises a method that includes a step for providing a first semiconductor die having a front side, a back side, a passivation layer on the back side, a first circuit component and a second circuit component. The method further includes step for forming a first through-silicon via and a second through-silicon via in said first semiconductor die; step for electrically coupling said first circuit component to said first through-silicon via; step for electrically coupling said second circuit component to said second through-silicon via; and step for forming a trace on said back side to electrically couple said first through-silicon via and said second through-silicon via.

Another aspect comprises a semiconductor die that includes a body portion including a plurality of circuit components; front means for providing electrical coupling to said plurality of circuit components; back means for providing electrical coupling for a first electrical terminal to the plurality of circuit components by a first through-silicon via, wherein said back means includes a redistribution layer; and a second through-silicon via coupled to a third through-silicon via by a trace on the redistribution layer.

BRIEF DESCRIPTION OF THE DRAWINGS

The accompanying drawings are presented to aid in the description of embodiments and are provided solely for illustration of the embodiments and not limitation thereof.

DETAILED DESCRIPTION

Figure 1:
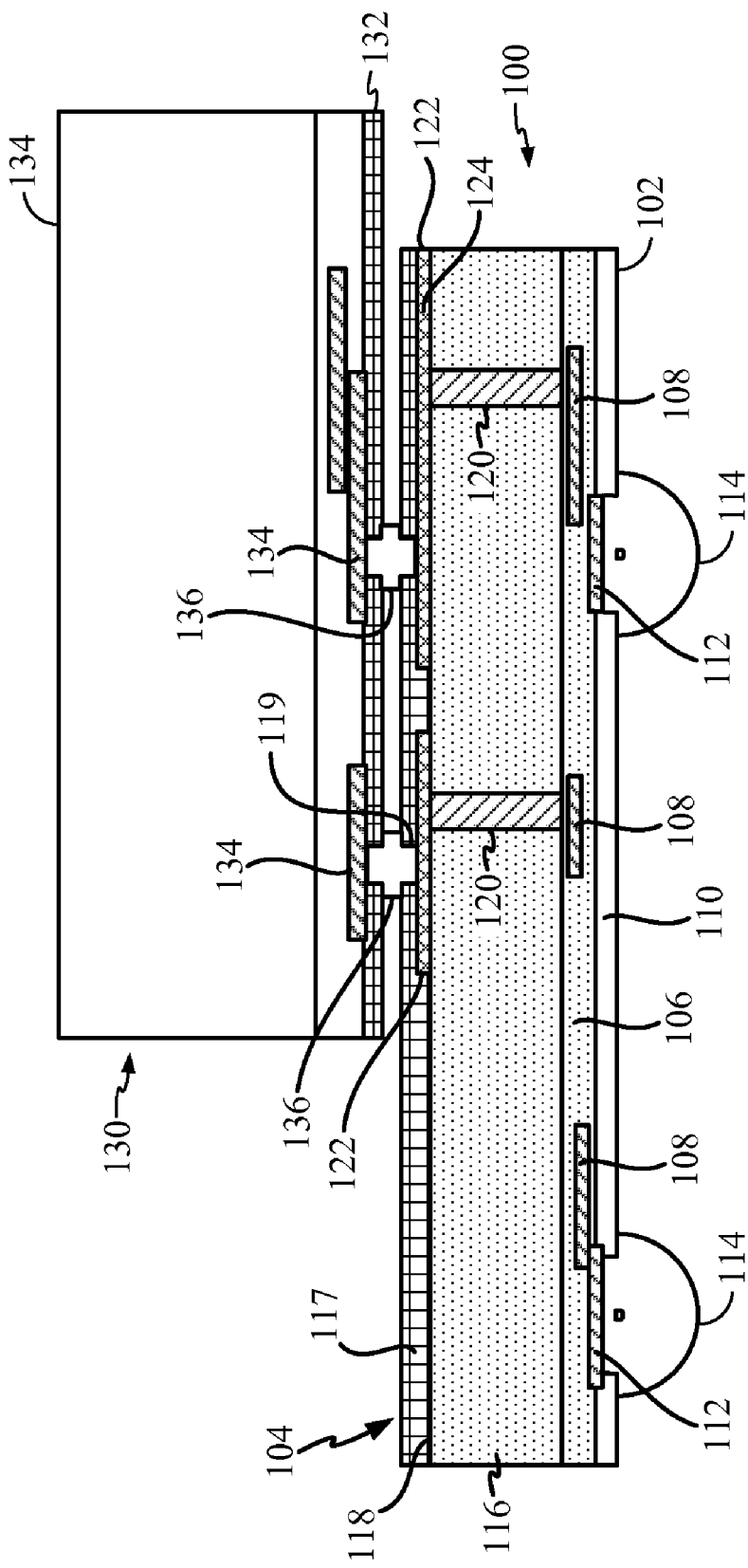
FIG. 1 is a sectional view of first and second conventional stacked dies electrically connected by contacts on the back side redistribution layer of the first die.

Aspects are disclosed in the following description and related drawings directed to specific embodiments. Alternate embodiments may be devised without departing from the scope of the invention. Additionally, well-known elements will not be described in detail or will be omitted so as not to obscure the relevant details of the disclosed embodiments.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. Additionally, the terms connect, connected, connecting, connection and variations thereof do not imply a direct connection and embodiments may included additional elements between the elements that are "connected". likewise, the terms couple, coupled, coupling, and variations thereof do not imply a direct coupling and embodiments may included additional elements between the elements that are "coupled".

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the embodiments may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

When multiple dies are used in a given environment, it is sometimes necessary to connect electrical components of one die to components in another die. This may be accomplished by forming traces along a motherboard or other substrate supporting the first and second dies. However, this type of interconnection can result in relatively long pathways between the first and second dies which in turn can lead to cross talk and/or signal degradation. This also takes up real estate on the motherboard or substrate that could beneficially be used for other purposes.

In order to shorten the pathways connecting two dies, it is known to stack one die on top of another die with the front side of the top die facing the back side of the bottom die. FIG. 1 illustrates a first or bottom die 100 having a front side 102 and a back side 104 with a single conductive layer 106 which comprises a plurality of traces 108 and active circuit components (not illustrated) interconnected by the traces 108. "Circuit component" will be used herein to refer both to active components such as transistors and to the traces, such as the trace 108 that electrically connect these components. A dielectric layer 110 covers the conductive layer 106, and openings 112 are formed in the dielectric layer 110 to provide access to the traces 108 so that conductive solder balls 114 can be attached to the dielectric layer 110 and provide an electrical pathway from the solder balls 114 to the circuit components in the bottom die 100. A silicon layer 116 covers the conductive layer 106 and includes a back surface 118 with a passivation layer 117 forming the back side 104 of the bottom die 100. Those skilled in the relevant arts will appreciate that dies such as the first die 100 may include a plurality of conductive layers separated by a plurality of dielectric layers and that vias will be used to electrically connect circuit components (including active components and traces) on one layer with circuit components on another layer. For simplicity of illustration, only a single metal layer is shown.

In order to allow an electrical connection with a second or top die 130 stacked on the back side 104 of the bottom die 100, it is known to form vias 120 that extend to the back surface 118 of the bottom chip 100 and to electrically connect those vias 120 to terminals comprising bonding pads 122 on the back surface 118 of the bottom die 100. An opening 119 in the passivation layer 117 is also provided to allow electrical connections to the bonding pads 122. Vias such as the vias 120 that extend through a silicon body in this manner may be referred to as "through-silicon vias." The bonding pads 122 may be located directly adjacent a particular through-silicon via 120 or may be spaced therefrom by a lead 124. In this manner, connections to the bottom die 100 can be made in a flexible manner, and the bonding pads 122 can be placed where necessary in view of the connections on the second die 130. These bonding pads 122 and associated leads 124 on the back surface 118 of the bottom die 100 may be referred to as the redistribution layer of the bottom die 100.

Second die 130 includes a front side 132 and a rear side 134 and a plurality of circuit components 136 between the front side 132 and rear side 134. Microbumps 136 provide an electrical connection to the circuit components 134 of the second die 130.

The microbumps 136 are electrically connected to the bonding pads 122 of the bottom die 100 through the passivation layer 117 of the bottom die 100, and in this manner, an electrical connection is formed between the circuit components 134 of the second die 130 and the circuit components 108 of the first die 100. This arrangement may shorten the distance that signals travel between the bottom die 100 and the top die 130 and may reduce cross talk and otherwise improve chip performance. The second die 130 may in turn have a redistribution layer (not illustrated) and be connected to another chip stacked thereabove (not illustrated) as will be understood by those of ordinary skill in the art.

Figure 2:
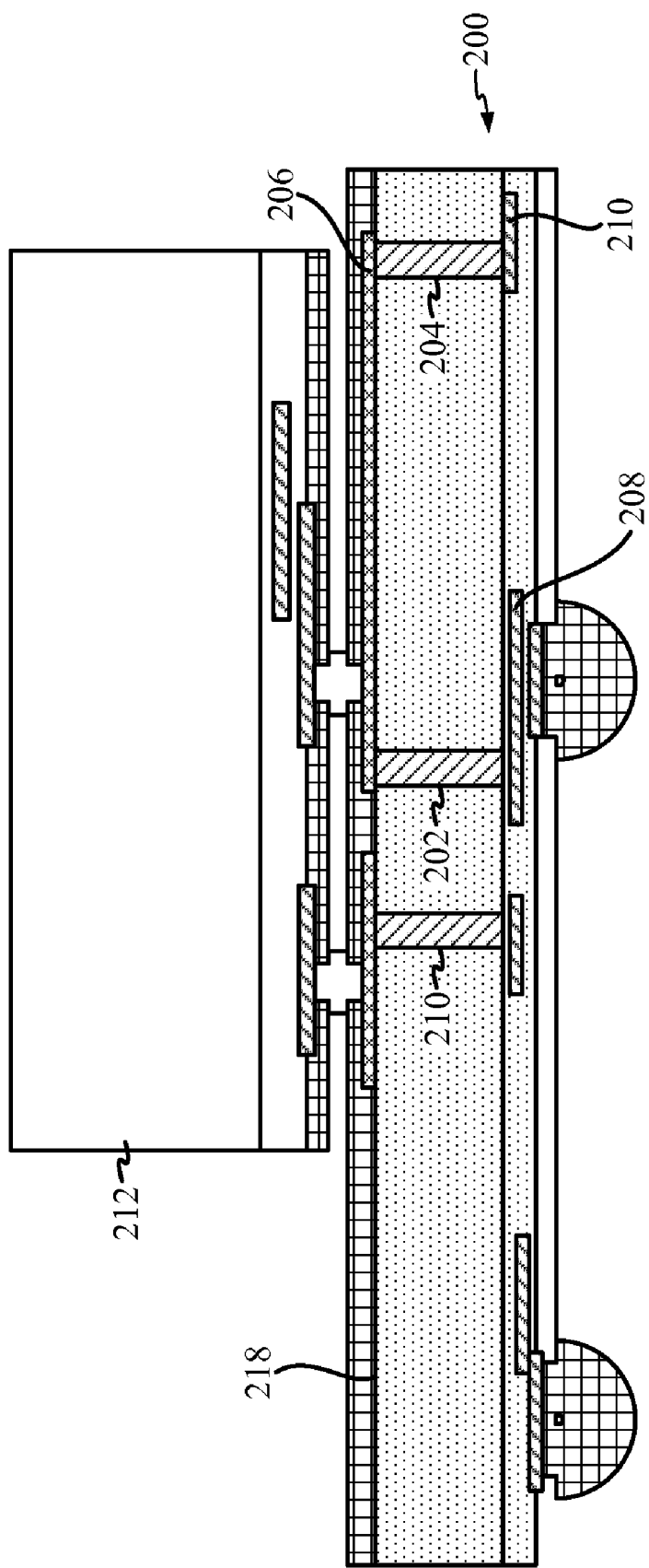
FIG. 2 is a sectional view of stacked dies wherein the redistribution layer of the first die includes a trace coupling two through-silicon vias of the first die.

Reference is now made to FIG. 2. The present inventors have recognized that the back surface of a die can be used to form interconnections between various parts of a bottom die 200 to provide flexibility in chip design and additional options when determining how to route connections between various circuit components within first die 200. As illustrated in FIG. 2, bottom die 200 is provided with a second through-silicon via 202 and a third through-silicon via 204 which are electrically connected by a trace 206 on back surface 218 of bottom die 200. Second through-silicon via 202 is connected, for example, to a second circuit component 208, and third through-silicon via 206 is connected to a third circuit component 210 on bottom die 200. Thus, while first through-silicon via 210 is still used to provide a connection between first die 200 and second die 212, second through-silicon via 202 and third through-silicon via 204 are used to interconnect circuit components on first die 200. The electrical and density properties of the redistribution layer metal from which trace 206 is formed may be different from the properties of traditional metal resources found on a chip front side. However, when warranted by frequency, power and real estate requirements, the redistribution layer metal can provide useful interconnections for circuit components on bottom die 200 and reduce the need for additional front side metal layers.

Figure 3:
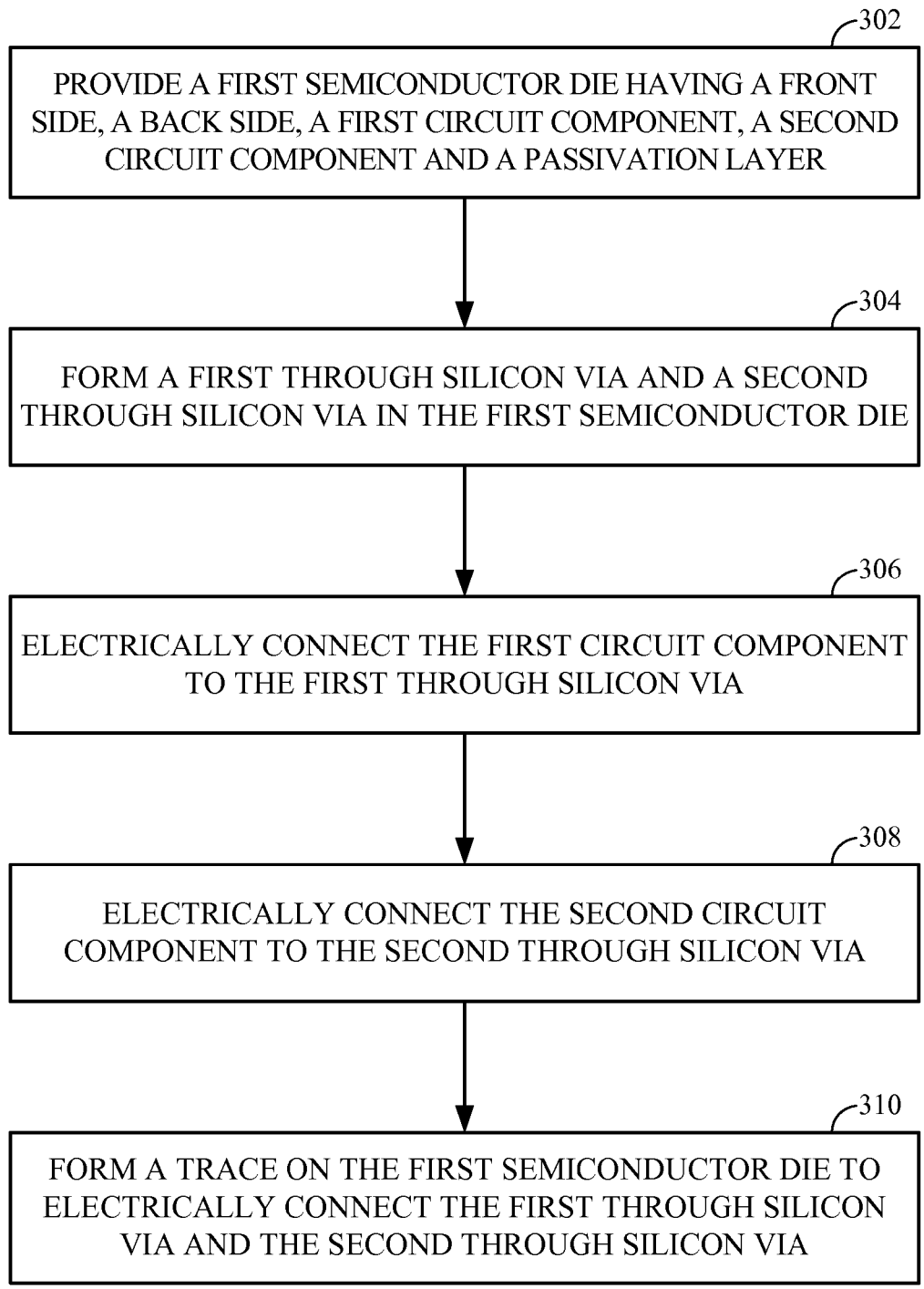
FIG. 3 is a flow chart illustrating a method of coupling circuit components on a die.

FIG. 3 illustrates a method of providing electrical connections in a die. The method includes a block 302 of providing a first semiconductor die having a front side, a back side, a first circuit component, a second circuit component and a passivation layer, a block 304 of forming a first through-silicon via and a second through-silicon via in the first die, and a block 306 of electrically connecting the first circuit component to the first through-silicon via. The method also includes a block 308 of electrically connecting the second circuit component to the second through-silicon via and a block 310 of forming a trace on the back side to electrically connect the first through-silicon via and the second through-silicon via.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the invention.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM, a solid state memory device, such as a flash-drive, or other optical disk storage, magnetic disk storage or other magnetic storage devices, or any other medium that can be used to carry or store desired program code in the form of instructions or data structures and that can be accessed by a computer. Also, any connection is properly termed a computer-readable medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

It will be appreciated that dies as illustrated for example in FIG. 2, may be included within a mobile phone, portable computer, hand-held personal communication system (PCS) unit, portable data units such as personal data assistants (PDAs), GPS enabled devices, navigation devices, set top boxes, music players, video players, entertainment units, fixed location data units such as meter reading equipment, or any other device that stores or retrieves data or computer instructions, or any combination thereof. Accordingly, embodiments of the disclosure may be suitably employed in any device which includes such dies.

The foregoing disclosed devices and methods may be designed and are configured into GDSII and GERBER computer files, stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Accordingly, embodiments can include machine-readable media or computer-readable media embodying instructions which when executed by a processor transform the processor and any other cooperating elements into a machine for performing the functionalities described herein as provided for by the instructions. Accordingly, the scope of the invention is not limited to illustrated examples and any means for performing the functionality described herein are included in embodiments.

While the foregoing disclosure shows illustrative embodiments, it should be noted that various changes and modifications could be made herein without departing from the scope of the invention as defined by the appended claims. The functions, steps and/or actions of the method claims in accordance with the embodiments described herein need not be performed in any particular order. Furthermore, although elements of embodiments may be described or claimed in the singular, the plural is contemplated unless limitation to the singular is explicitly stated.

What is claimed is:

1. A semiconductor die comprising:
a body portion including a plurality of circuit components;
a front side comprising electrical couplings to said plurality of circuit components;
a back side including a redistribution layer having a first electrical terminal coupled to the plurality of circuit components by a first through-silicon via; and
a second through-silicon via coupled to a third through-silicon via by a trace on the back side redistribution layer.

2. The semiconductor die of claim 1, wherein said body portion comprises a plurality of conductive layers separated by layers of dielectric material and a passivation layer of silicon comprises the back side of said die, wherein said passivation layer includes an opening exposing a portion of said first electrical terminal.

3. The semiconductor die of claim 1 wherein said first electrical terminal comprises a bonding pad for electrically coupling a second semiconductor die to the first semiconductor die.

4. The semiconductor die of claim 1 wherein a first one of said plurality of circuit components is coupled to a second one of said plurality of circuit components by said trace.

5. The semiconductor die of claim 1 wherein a first one of said plurality of circuit components is coupled to a second one of said plurality of circuit components by an electrical pathway including said second through-silicon via, said trace and said third through-silicon via.

6. The semiconductor die of claim 1 integrated into at least one memory element.

7. The semiconductor die of claim 1 further including a device, selected from the group consisting of a set top box, music player, video player, entertainment unit, navigation device, communications device, personal digital assistant (PDA), fixed location data unit, and a computer, into which the die is integrated.

8. A semiconductor die comprising:
a body portion including a plurality of circuit components and a plurality of conductive layers separated by layers of dielectric material and a passivation layer forming a back side of the die;
a front side comprising electrical couplings to said plurality of circuit components;
first and second through-silicon vias extending to said back side; and
a trace on said back side electrically coupling said first and second through-silicon vias.

9. The semiconductor die of claim 8 including a third through-silicon via and a bonding pad on the back side of the die electrically coupled to said third through-silicon via, wherein the passivation layer includes an opening exposing a portion of said bonding pad.

10. The semiconductor die of claim 8 wherein a first one of said plurality of circuit components is electrically coupled to said first through-silicon via and a second one of said plurality of circuit components is electrically coupled to said second through-silicon via.

11. The semiconductor die of claim 8 integrated into at least one memory element.

12. The semiconductor die of claim 8 further including a device, selected from the group consisting of a set top box, music player, video player, entertainment unit, navigation device, communications device, personal digital assistant (PDA), fixed location data unit, and a computer, into which the die is integrated.

13. A semiconductor component comprising:
a first die comprising:
a body portion including a plurality of circuit components;
a front side comprising electrical couplings to said plurality of circuit components;
a back side including a redistribution layer having a first electrical contact coupled to at least one of the plurality of circuit components by a first through-silicon via; and
a second through-silicon via electrically coupled to a third through-silicon via by a trace on the back side redistribution layer; and
a second die stacked on said first die, said second die having a front side having at least one conductive element electrically coupled to said first die first electrical contact.

14. The semiconductor component of claim 13 wherein said trace is disposed between said back side of said first die and said second die and is spaced from said second die.

15. The semiconductor component of claim 13 wherein said second die includes a body portion including a plurality of circuit components and a plurality of conductive layers separated by layers of dielectric material.

16. The semiconductor component of claim 15 wherein at least one of said plurality of circuit components of said second die is electrically coupled to said at least one of said plurality of circuit components of said first die by said first electrical contact and said first through-silicon via.

17. The semiconductor component of claim 13 wherein a second one of said plurality of circuit components on said first die is electrically coupled to a third one of said plurality of circuit components on said first die by a pathway including said second through-silicon via, said trace and said third through-silicon via.

18. The semiconductor component of claim 16 including a microbump extending through the passivation layer to couple the first through-silicon via to the at least one conductive element of the second die.

19. The semiconductor component of claim 13 integrated into at least one memory element.

20. The semiconductor component of claim 13 further including a device, selected from the group consisting of a set top box, music player, video player, entertainment unit, navigation device, communications device, personal digital assistant (PDA), fixed location data unit, and a computer, into which the semiconductor component is integrated.

21. A method comprising:
providing a first semiconductor die having a front side, a back side, a passivation layer on the back side, a first circuit component and a second circuit component;
forming a first through-silicon via and a second through-silicon via in said first semiconductor die;
electrically coupling said first circuit component to said first through-silicon via;
electrically coupling said second circuit component to said second through-silicon via; and
forming a trace on said back side to electrically couple said first through-silicon via and said second through-silicon via.

22. The method of claim 21 including:
forming a third through-silicon via in said first die;
stacking a second die having an electrical contact on said first die; and
electrically coupling second die electrical contact to said third through-silicon via by a conductive element extending through said passivation layer.

23. The method of claim 21 including:
forming a third through-silicon via in said first die;
stacking a second die having an electrical contact on said first die; and
forming a microbump that extends through said passivation layer to electrically couple said second die electrical contact to said third through-silicon via.

24. A method comprising:
step for providing a first semiconductor die having a front side, a back side, a passivation layer on the back side, a first circuit component and a second circuit component;
step for forming a first through-silicon via and a second through-silicon via in said first semiconductor die;
step for electrically coupling said first circuit component to said first through-silicon via;
step for electrically coupling said second circuit component to said second through-silicon via; and
step for forming a trace on said back side to electrically couple said first through-silicon via and said second through-silicon via.

25. The method of claim 24 including:
step for forming a third through-silicon via in said first die;
step for stacking a second die having an electrical contact on said first die; and
step for electrically coupling said second die electrical contact to said third through-silicon via by a conductive element extending through said passivation layer.

26. The method of claim 24 including:
step for forming a third through-silicon via in said first die;
step for stacking a second die having an electrical contact on said first die; and
step for forming a microbump that extends through said passivation layer to electrically couple said second die electrical contact to said third through-silicon via.

27. A semiconductor die comprising:
a body portion including a plurality of circuit components;
front means for providing electrical coupling to said plurality of circuit components;
back means for providing electrical coupling for a first electrical terminal to the plurality of circuit components by a first through-silicon via, wherein said back means includes a redistribution layer; and
a second through-silicon via coupled to a third through-silicon via by a trace on the redistribution layer.

28. The semiconductor die of claim 27, wherein said body portion comprises a plurality of conductive layers separated by layers of dielectric material and a passivation layer of silicon comprises the back means of said die, wherein said passivation layer includes an opening exposing a portion of said first electrical terminal.

29. The semiconductor die of claim 27 wherein said first electrical terminal comprises a bonding means for electrically coupling a second semiconductor die to the first semiconductor die.

30. The semiconductor die of claim 27 wherein a first one of said plurality of circuit components is coupled to a second one of said plurality of circuit components by said trace.

31. The semiconductor die of claim 30 wherein a first one of said plurality of circuit components is coupled to a second one of said plurality of circuit components by an electrical pathway including said second through-silicon via, said trace and said third through silicon via.

32. The semiconductor die of claim 27 integrated into at least one memory element.

33. The semiconductor die of claim 27 further including a device, selected from the group consisting of a set top box, music player, video player, entertainment unit, navigation device, communications device, personal digital assistant (PDA), fixed location data unit, and a computer, into which the die is integrated.

* * * * *